United States Patent [19]

Tailliet

[11] Patent Number: 5,604,702

[45] Date of Patent: Feb. 18, 1997

[54] DYNAMIC REDUNDANCY CIRCUIT FOR MEMORY IN INTEGRATED CIRCUIT FORM

[75] Inventor: François Tailliet, Epinay sur Seine, France

[73] Assignee: SGS-Thomson Microelectronics S.A., Saint Genis Pouilly, France

[21] Appl. No.: 306,500

[22] Filed: Sep. 15, 1994

[30] Foreign Application Priority Data

Sep. 20, 1993 [FR] France .................................. 93 11169

[51] Int. Cl.$^6$ ................................................. G11C 7/00
[52] U.S. Cl. ................................ 365/200; 365/230.06
[58] Field of Search ............................. 365/200, 189.07, 365/230.06; 371/10.3

[56] References Cited

U.S. PATENT DOCUMENTS

| | | | |
|---|---|---|---|
| 4,051,354 | 9/1977 | Choate | 235/312 |
| 4,376,300 | 3/1983 | Tsang | 365/200 |
| 4,583,179 | 4/1986 | Horii et al. | 365/200 X |
| 4,701,887 | 10/1987 | Ogawa | 365/200 |
| 4,733,394 | 3/1988 | Giebel | 371/21 |
| 4,849,939 | 7/1989 | Muranaka et al. | 365/200 |
| 4,862,416 | 8/1989 | Takeuchi | 365/200 X |
| 5,097,447 | 3/1992 | Ogawa et al. | 365/200 |

FOREIGN PATENT DOCUMENTS

| | | |
|---|---|---|
| 0392895 | 10/1990 | European Pat. Off. . |
| 0448970 | 10/1991 | European Pat. Off. . |
| 2136992 | 9/1984 | United Kingdom . |

Primary Examiner—Joseph A. Popek
Attorney, Agent, or Firm—David M. Driscoll; James H. Morris

[57] ABSTRACT

To prompt a repairing operation as and when defective cells appear in an integrated circuit memory, there is provided an auxiliary memory related to a programmable comparator. Whenever the cells of the memory are to be read, the auxiliary memory is read and its content is compared with the address selected in the memory array. The result of this comparison produces, in real time, the addressing signals of a redundant cell and signals for the neutralization of the initially encountered cell. This system can be used more particularly in the field of EEPROM type memories.

44 Claims, 3 Drawing Sheets

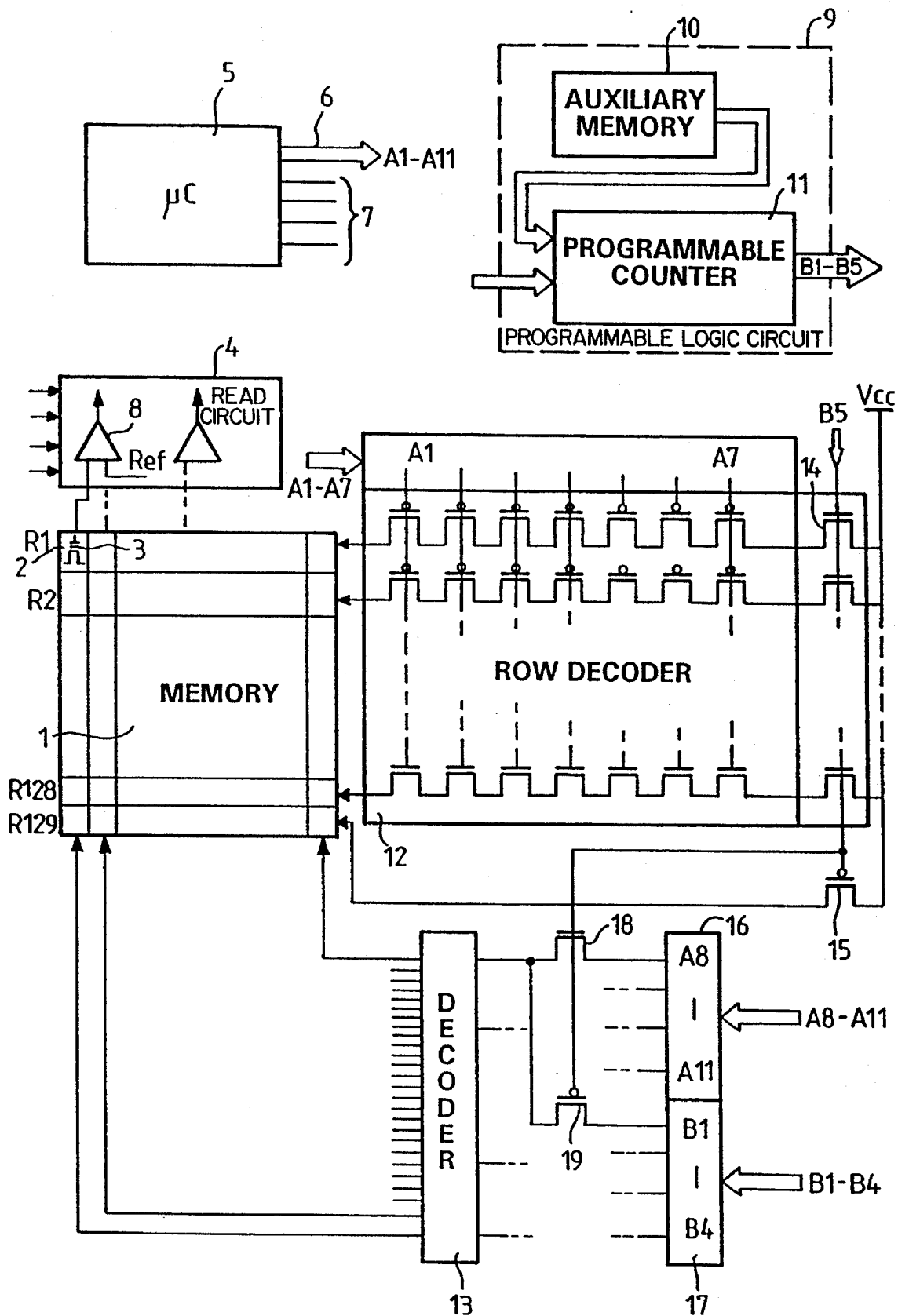
FIG_1

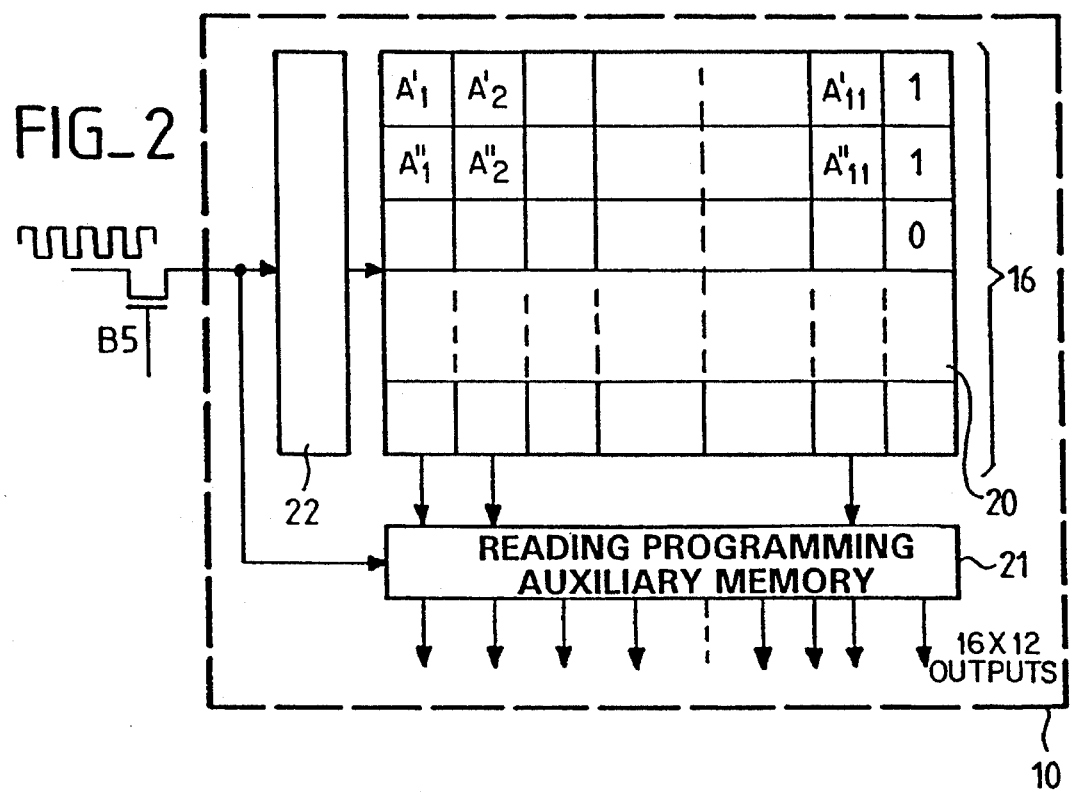
FIG_2
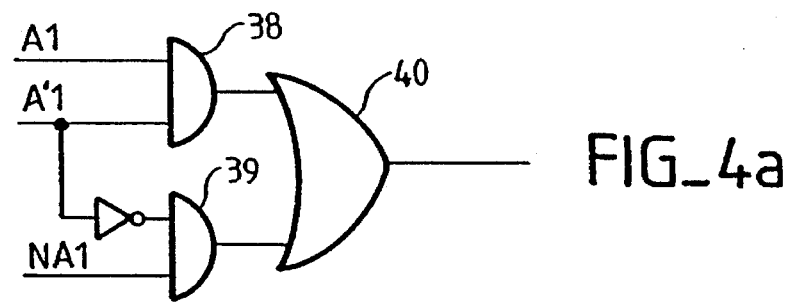
FIG_4a
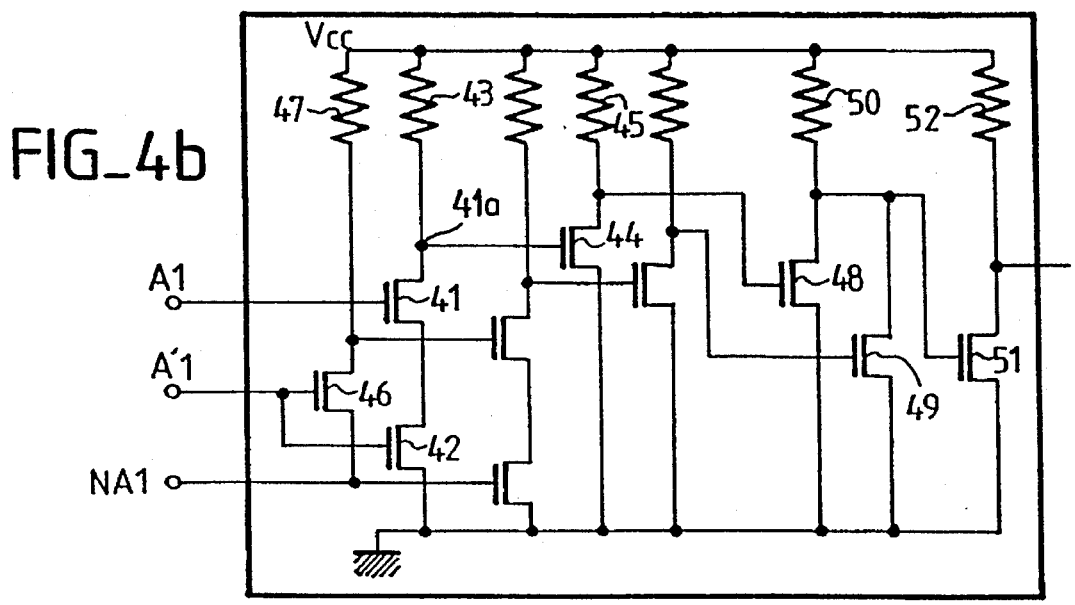
FIG_4b

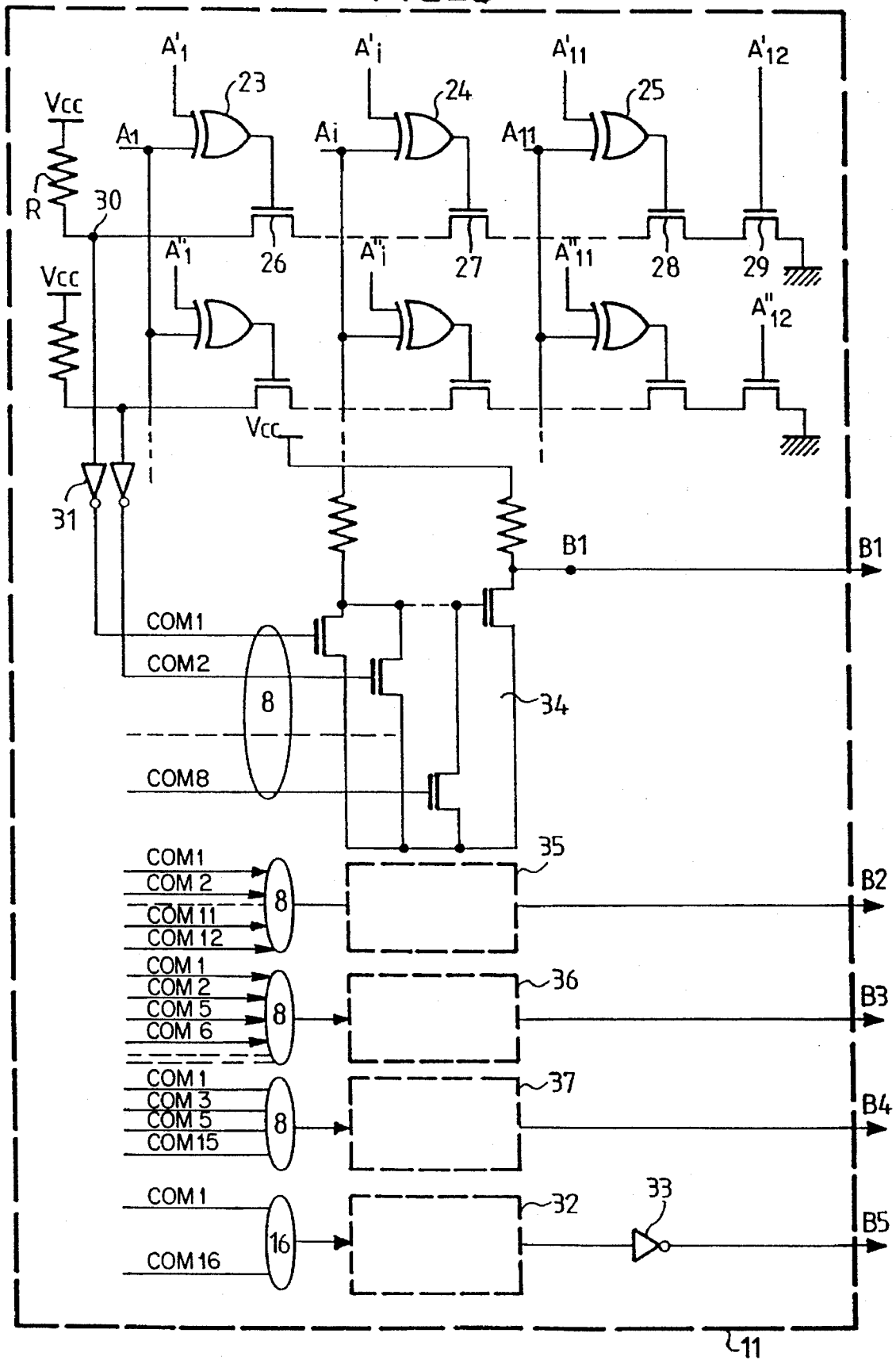

DYNAMIC REDUNDANCY CIRCUIT FOR MEMORY IN INTEGRATED CIRCUIT FORM

BACKGROUND OF THE INVENTION

1. Field of the Invention

The present invention relates to a dynamic redundancy circuit for memories in integrated circuit form. It can be used especially in the field of non-volatile memories, notably that of EEPROM type memories. It can also be used in the field of microcontrollers, namely microprocessors that are provided, on one and the same integrated circuit, with a non-volatile memory storing programs or data elements.

2. Discussion of the Related Art

The use of non-volatile-type of memories is presently limited by the number of writing and erasing operations that it is capable of sustaining. A memory cell of this type has, a floating-gate transistor that is charged or discharged with electrical charges or, depending on the binary state to be memorized by the cell. The phenomena by which these dielectric charges undergo leakage and are kept trapped in an insulating region located between the conduction channel of the floating-gate transistor and the floating gate, result in a situation where it becomes increasingly difficult to carry out programming or erasing operations with the aging, deterioration or malfunctioning of the cell. Although modern technology makes it possible to carry out a substantial number of cycles (for example one hundred thousand cycles), this performance is still insufficient in certain cases. In practice, when just one memory cell of such a circuit is affected, the entire circuit has to be discarded.

There are known redundancy circuits and known ways of implementing these circuits. These circuits are used chiefly at the time of the testing of the memory integrated circuits, such as when they are manufactured. To this end, when a memory is manufactured, each of these memory cells is tested one-by-one. When a memory cell in poor condition is detected, for example, because this memory cell cannot be programmed or erased or because it is short-circuited or some other defect, then, the neutralization of this memory cell is prompted, and it is replaced by a supplementary memory cell. This replacement consists in replacing the address of the cell in poor condition by the address of the supplementary replacement cell. This is obtained by a specific operation which includes the opening of certain addressing switches of the integrated circuit and the closing of other switches linked to the foregoing switches. These addressing switches may be formed by fuses. The opening and the closing of these addressing switches are caused by a circuit external to the integrated circuit having the memory. This opening and closing is controlled by software contained in the testing machine. This software takes account of the particular structure of the memory and of its redundancy circuits.

During use, the principle of the programming of the erasure of a memory cell is as follows. When a cell has to be programmed or erased, a microprogram is carried out by an automaton included in the memory. It is aimed at the precharging, with a programming or erasing voltage, of the connections providing access to the cell and then at the selection, by addressing, of the cell to be modified. After this operation, in the case of the EEPROM cells, the cell to be modified is not verified to observe its state. There is no detection, in practice, of the fact that the integrated circuit EEPROM memory needs to be discarded because its operation is no longer reliable.

In the case of the EPROM cells, on the contrary, there are known ways of finding out whether the state obtained after the modification is in accordance with the modified state to be obtained. If necessary, the operation of modification, writing/erasure is repeated a certain number of times. Furthermore the number of attempts is counted. When this number of attempts exceeds a predetermined number, for example, five or six attempts, an automaton of the memory is capable of sending out an error signal to indicate that the concerned memory cell is no longer in proper working condition.

SUMMARY OF THE INVENTION

In the invention, a dynamic redundancy circuit is used to interpret an error signal, such as the one discussed above, and to interpret accesses of the defective cell in order to reroute the address of this defective cell to an address of a redundancy cell and to carry out the corresponding programming or erasure of the redundancy cell instead of the defective cell. The operation is transparent to the user.

The most important result is that instead of having a memory that is capable of carrying out a hundred thousand erasure/writing cycles, there is now obtained a memory capable of carrying out several million erasure/writing cycles, Indeed, it can be seen statistically that it is always the weakest cells that limits the lifetime of the prior art devices. The fact that defective cells can be effectively replaced considerably increases the lifetime of the integrated circuit memory of the present invention.

An object of the memory, therefore, is an electrically programmable and erasable non-volatile integrated circuit memory having memory words. An auxiliary memory is included to memorize addresses of defective memory words, and a circuit for the comparison of a selection or input address of a memory word with an address memorized in the auxiliary memory is also included. A re-addressing circuit for the selection, as a replacement, of another word of this memory is also included, so that when a selection address matches an address in the auxiliary memory the re-addressing circuit directs the access to a replacement address of the memory.

BRIEF DESCRIPTION OF THE DRAWINGS

The invention will be understood more clearly from the following description and from the appended figures. These figures are given purely by way of an indication and in no way restrict the scope of the invention. Of these figures:

FIG. 1 shows a schematic view of a memory in integrated circuit form provided with a dynamic redundancy circuit according to the invention;

FIG. 2 shows an auxiliary memory used for the storage, as and when they appear, of the addresses of defective cells to be replaced;

FIG. 3 shows a programmable logic circuit capable of producing replacement cell address signals instead of defective cell address signals; and FIGS. 4a and 4b show a circuit for the selection of addresses from among the addresses of defective cells to select a right replacement address.

DETAILED DESCRIPTION

A rerouting circuit is known, for example, from the PCT patent application No. WO 90/812364. In this patent application, a memory is repaired by interposing an address encoder so that the information elements to be stored in the memory are stored in replacement memory regions designated by the address encoder rather than in defective regions. The same principle is also implemented in the patent application U.S. Pat. No. A-4 310 901. These teachings, however, fail to provide for an automatic, address rerouting integrated circuit as in the invention, namely a circuit that is put into operation as it is needed.

The invention relates, more particularly, to serial access EEPROMs. Indeed, for this type of memory, the problem of access times is less of a constraint, and consequently, it is easier to carry out an address rerouting operation. However, the invention can also be applied, as shall be seen, to parallel-access EEPROMs or other memory devices. The circuit is simply a little more complicated in this case.

FIG. 1 shows one embodiment of the invention, in which a non-volatile circuit in integrated circuit form is provided with a dynamic redundancy circuit. The memory 1 has a certain number of memory words. For descriptive purposes, it is assumed memory 1 has 2048 EEPROM memory words. Each memory word may have 8, 16, 32 or n bits. Each memory cell, corresponding to one bit, comprises a transistor 2 with a floating gate 3. The memory has an erase/write circuit 4 and is operated by an automaton 5 delivering command signals 7. Address signals 6 are delivered by address decoders. These are known elements. The read/write circuit has amplifiers 8 for the reading as well as circuits to erase or program a cell. As is known, amplifiers 8 subject a bit line leading to this cell to a corresponding voltage and cause the corresponding voltage to be applied to this cell under the effect of an address signal selecting the concerned cell.

In the invention, the dynamic redundancy circuit may be formed as, a dynamically programmable logic circuit 9. The logic circuit 9 has a non-volatile type of auxiliary memory 10 to memorize addresses of cells or memory words, that are defective, for example, because the quality of their storage is inadequate. The circuit 9 also has a comparison circuit 11 to compare an address of a selected or desired memory word with each of the addresses of a list of addresses stored in the auxiliary memory 10. The circuit 9 is capable of producing re-addressing signals B1–B5 as a function of this comparison. These re-addressing signals B1–B5 are applied to a re-addressing circuit, further described below, for the selection, as a replacement, of another cell or another word of the memory.

In the example where the memory has 2048 memory words, the addresses of these memory words are expressed in binary form with eleven bits. These eleven bits are called A1–A11. These eleven bits are applied to two decoders. A first decoder 12, called a row decoder, receives address bits A1 to A7. A second decoder 13, called a column decoder, receives the address bits A8 to A11. The principle of these decoders is known. They include, cascade-connected with each selected row or column, a series of N-type pass transistors forming an AND gate having as many inputs as transistors. There are many alternative embodiments of such decoders. For example, in a first row, the decoder 12 has a cascade of seven N-type pass transistors interposed between the first row R1 of the memory and a power supply $V_{cc}$ of the circuit. When the control gates of these transistors receive an asserted address bit, respectively A0, A1, . . . A7, the word line of the first row R1 is taken to $V_{cc}$. By contrast, at this time, the 128th word line, namely the word line of the 128th row R128, which is cascade-connected with seven transistors which are also N type transistors receiving complementary address signals, A0/, A1/, . . . A7/ respectively, is disconnected. Similarly, the decoder 13 receives the address signals A8 to A11 and A8/ to A11/ and selects one out of sixteen bit lines (or groups of bit lines if the memory is organized in words of 8, 16, 32, . . . bits).

The principle of the invention is based on simplifying the redundancy circuits to the greatest possible extent. To this end, the re-addressing circuit includes, cascade-connected with each word line, an additional transistor such as the transistor 14 (word line corresponding to the row R1). This additional transistor receives a signal B5 pertaining to the detection or non-detection of an address of a defective cell of the memory 1. The programmable logic circuit 9 thus produces address signals B1 to B4 to re-rate the defective address as well as an additional signal B5, which indicates whether the address is detected as non-defective or defective. Consequently, the transistor 14, depending on its state, permits or neutralizes the selection of the row R1. Rather than having a transistor 14 before each of the word lines cascade-connected with its seven decoding transistors, it is possible to have only one transistor 14 interposed between the supply $V_{cc}$ and all these lines.

The memory 1 has an additional row R129. The cells of this 129th row are connected to the erase/write circuit 4 in the same way as the cells of the other rows. The bit lines extend simply up to the row R129. The selection of the row 129 is obtained by turning on a transistor 15, in this case a P type transistor, having a polarity which is the reverse of that of the transistor 14. The transistor 15 then receives the same Signal B5 at its gate, and it is also connected to the supply $V_{cc}$. When the signal B5 is equal to zero, it selects the row R129 while all the 128 first rows are neutralized.

The address bits A8 to A11 are sent to the decoder 13 by means of flip-flop circuit 16. This circuit 16 has four outputs connected to four inputs of the decoder 13. The re-addressing circuit of the invention furthermore includes another flip-flop circuit 17 to store four address bits B1–B4 used for replacing the address bits A8 to A11 if the memory address is detected as corresponding to a defective word.

The decoder 13 has four inputs connected selectively to four outputs of the circuits 16 and 17. Depending on whether the "normal" address or the replacement address is intended, circuit 16 or 17 is selected with transistors 18 or 19 receiving the signal B5 at their gate. As a variant, the transistors 18 and 19 are both N type transistors and respectively receive signals B5 and B5/. Likewise the circuits 16 and 17 may include enable inputs that receive these signals.

In the example shown in FIG. 1, a first input of the decoder 13 is linked with the first output of the circuit 16 if the signal B5 is equal to 1 and is linked with the first output of the circuit 17 if the signal B5 is equal to zero. Since the decoder 13 has four inputs, there are four pairs of transistors such as 18–19 in the re-addressing circuit. The decoder 13 then selects the appropriate columns.

The re-addressing circuit of the invention therefore includes the transistors 14–15, the pairs of transistors 18–19 and the circuit 17. It will be noted that these transistors and this circuit 17 are equivalent to transistors already existing in the decoder 12 or the circuit 16, so that their manufacture does not necessitate any additional masking or implantation steps.

The selection is especially simple inasmuch as the read/write/erase circuit 4 and the decoders 12 and 14 are common to the memory 1 and to the redundant part of this memory. Furthermore, the decoders 12 and 13 are only very slightly modified. Redundancy row R129 makes it possible, in practice, to set the redundancy rows apart, statistically, from the defective cells. This runs counter to the presently used approaches in which redundancy cells are parallel-connected, physically side-by-side with cells to be repaired. When a cell has a defect, it is common for the immediately neighboring cell to have the same defect. As such, prior approaches are not efficient. With the row R129 being kept physically further apart, the invention reduces this problem.

FIG. 2 along with FIG. 3 shows the programmable logic circuit 9 according to one embodiment of the invention. FIG. 2 shows a programmable auxiliary memory 10. FIG. 3 shows the logic circuit 11. The following is a description of the principle of operation. In one example, the auxiliary memory 10 has 16 words to record 16 addresses of defective cells (or defective words) in the memory 1. These 16 addresses are each recorded with 11 bits. A twelfth bit is associated with each eleven-bit address to indicate whether the stored address actually corresponds to an address of defective cells (i.e., a so-called "valid bit"). The memory 10 has a memory array 20 comprising sixteen 12-bit words. The memory array 20 is linked with a a circuit 21 for the reading and programming of this memory 10.

When a word is to be written in the memory 1, this word is memorized in registers of a dynamic memory and its address where this word must be written is memorized. (For an erasing operation, all that would be memorized is the erasing address.) Then, these write (or erase) operations are carried out. Once the operation has been carried out, the contents at the concerned address of the memory 1 are compared with the word memorized in the dynamic register. If the memorized content is identical to the content written in the memory 1, the programming operation has been done properly. If not, it is deduced therefrom that the memory cell or the memory word located at the concerned address is defective and that it has to be repaired. A method of verification such as this is already known in the field of EPROMs. In addition, other verification techniques are also known.

To repair the memory cell, the defective address is stored in the memory 10. The logic circuit 11 receives the addresses from memory 10 and interprets the address stored in the memory 10 to address a cell or word in the row 129 of the memory 1. The content of the word to be written is then written in a word of this row R129 whose address is now decoded by the circuit 11. Initially, it will be noted that the memory 10 is of the non-volatile type, for example, the same type as the memory 1, and may be constructed of the same regular structure as memory 1. In this case, it may be written or erased by means of the circuits 4 to 8 or by means of circuits of this type.

When a memory word of the memory 1 is to be selected, the operation starts by comparing the address of this word to be selected with each of the addresses stored in the memory 10. One possible way is to compare the desired address successively with the first address stored in the memory 10, then with the second address stored in the memory 10, and so on successively until the last one. If this comparison does not reveal any matches, it means that the address being dealt with is an address of a word or cell of the memory 1 that is in good condition. If, on the contrary, this is not the case and a match is found, then at least one of the comparisons has revealed that this address corresponds to a defective word. In this case, the reading of the memory 10 can be stopped at the position of the address of the memory cell detected.

In a preferred variant, the circuit used for the programmable read/write circuit 21 will be a read circuit capable of simultaneously reading all the memory cells of the memory array 20. This reading is done at the same time as the defective address is sent to the decoders 12 and 13. A read circuit such as this may be of the type described in the United States patent U.S. Pat. No. A-5 144 582. In this case, the memory cells of the memory 20 are dynamic type memory cells organized so that there is no need for a read amplifier to read each of these cells. The content of the non-volatile memory is read entirely when the integrated circuit is put under voltage and its content is stored in dynamic memory, such as flip-flop circuits.

When a circuit such as this is powered, the dynamic memory is loaded with the contents of the associated non-volatile memory 20. When a memory cell of the memory array 1 has been repaired, the contents of these volatile memories of the memory 20 will be refreshed with the new contents of the non-volatile memories of this memory. In this way, at any time, the volatile memories will provide information on the cells of the memory 1 that are repaired and that have their addresses rerouted.

As a variant, a memory array 20 with standard non-volatile type cells may be linked to 12×16 read/write/erasure amplifiers.

The first row of the memory array 20 stores an address A1', A2' etc. . . . A11 and a corresponding valid bit A12'. The second row, stores a second defective address A1", A2" up to A11" and the valid bit A12". The third row and the other rows have stored bits whose content is immaterial, for this example, because their valid bit, i.e., the twelfth bit, is unasserted, indicating that these rows have not yet been used but may be used to repair future malfunctions.

FIG. 3 shows the programmable comparator circuit 11 of the invention. In practice, this circuit may be formed by a PLA (Programmable Logic Array) type of logic circuit that will have been programmed accordingly. In the specific case of the present description, this circuit comprises at least one set of Exclusive NOR (XNOR) logic gates such as 23 to 25. Each of the Exclusive NOR gates, for example, the gate 23, receives one bit of the defective address, for example A1, simultaneously with a bit of the same position read in a row of the memory 20, for example A1'. An Exclusive NOR gate compares the value of the address bit A1 with the bit A1' and delivers a signal at 1 if the two address bits compared are identical. The Exclusive NOR gates are thus assembled, by sets of eleven, and each of the sixteen groups pertain to each of the addresses recorded in the memory array 20. Exclusive NOR gates grouped together have their outputs connected to an eleven-input AND gate. This AND gate is formed, for example, in FIG. 3, by a cascade connection of eleven pass transistors 26 to 28 that are series-connected to one another by drain and source between the supply $V_{cc}$ and the ground. The inputs of the AND gate are constituted by the control gates of the transistors 26–28. Furthermore, an additional pass transistor 29 is also cascade-connected with the transistors 26 to 28. At its control gate, it receives the signal of the valid bit corresponding to the eleven address bits stored in the corresponding row of memory 20. In other words, if a group of eleven bits corresponds to an actually defective address stored in the memory 10, the AND gate 26–28 is put into operation by the transistor 29. If not, it is neutralized. The AND gate 26–28 is completed by connecting an output node 30 to $V_{cc}$ by resistor R and by connecting node 30 to inverter 31. This representation is exemplary only. In practice, the connection of the transistors will depend on the technology chosen to constitute the PLA circuit.

The references COM1, . . . COMi . . . , COM16 are applied to the signals that are available at output of the inverters such as 31 each corresponding to the comparisons of the address (A1–A11) to be selected in the memory 1 at a corresponding address, such as (A1'–A11') for the first row. In the circuit 11, there are therefore sixteen groups of Exclusive NOR gates and of cascades of transistors 26 to 29 to deliver sixteen signals COM1 to COM16. The signal B5 is produced by a sixteen-input OR gate 32 receiving the signals COM1 to COM16, series connected with an inverter 33.

Four eight-input OR gates 34 to 37 encode the signals COM1 to COM16 to produce replacement address signals B1 to B4. Thus, as soon as any one of the signals COM1 to COM16 goes to the state 1, the output of the gate 32 goes to the state 1, and the signal B5 goes to the state 0. The duplication of the sixteen cascades of the Exclusive NOR gates is related to the simultaneous reading of all the memory cells of the memory 20.

The OR type logic gate 34 receives signals COM1 to COM8 at its eight inputs. The signal B1 at the output of the gate 34 goes to the state 1 if any of these signals COM1 to COM8 is in the state 1. The gates 35 and 36 and 37 receive, for example, respectively signals COM1, COM2, COM3, COM4, COM9, COM10, COM11, COM12; and COM1, COM2, COM5, COM6, COM9, COM10, COM13, COM14; and COM1, COM3, COM5, COM7, COM9, COM11, COM15. Consequently, these gates 34 to 37 encode the binary states of the signals COMi differently to constitute new address bits B1 to B4.

If the approach chosen were to be that of the first alternative embodiment, that is the embodiment which serially compares each address in memory 20, rather than comparing all addresses simultaneously, and which is useful when the memory 1 is of the series EEPROM type, then the signals COM1 to COM16 would be gradually stored in flip-flop circuits of the same type as the flip-flop circuits 16 to 17 whenever a different row of the memory array 20 had been read. Subsequently, the working of all the OR gates 32 and 34 to 37 would be the same, validated by an end-of-reading of the memory 10.

FIGS. 4a and 4b show an exemplary embodiment of an Exclusive NOR gate 23. This Exclusive NOR gate 23 has two two-input AND gates 38 and 39. The AND gate 38 receives the signals A1 and A'1 respectively at its inputs. The gate 39 receives the complementary signals NA1 and NA1' at its inputs. The outputs of the AND gates 38 and 39 are connected to the inputs of a two-input OR gate 40. The output of the gate 40 constitutes the output of the Exclusive NOR gate. In practice, the output of the gate 40 is in the state 1 if the address bit A1 is identical to the address bit A'1, irrespectively of the values of these bits. The output 40 is at zero if the bit A1 is of a type opposite to that of the bit A1'.

FIG. 4b shows a symbolic embodiment of the circuit shown in FIG. 4a. The AND gate 38 is made by the cascade-connection of two N type transistors 41 and 42 with a resistor 43 between the supply $V_{cc}$ and the ground. The signal available at node 41a is applied to a control input of an inverter transistor 44. A similar assembly is made for the gate 39 receiving the signals NA1 directly and the signal A1' inverted in an inverter comprising a transistor 46 and a resistor 47. The outputs of the two AND gates are applied to a two-input OR gate. This OR gate is formed by two parallel-connected transistors 48 and 49 mounted between the ground and a terminal of a resistor 50 that is furthermore connected to the supply $V_{cc}$. The OR gate finally has an inverter provided with a transistor 51 and a resistor 52 to rectify the polarity of the signal.

Referring to FIG. 1, the circuit works as follows. When an address is sent to the decoders 12 or 13, it is sent at the same time to the programmable logic circuit 9. This circuit 9 then immediately causes the reading of all the rows of the memory array 20 simultaneously. The address bits stored in the memory array 20 are then compared in the comparator circuit 11 (FIG. 3) with the address bit of the memory word to be selected in the memory 1. If the word or memory cell to be selected is in the right state, the signal B5 remains in the state 1 and the dynamic redundancy circuit is inhibited. That is, no readdressing of the access is performed. If, on the contrary, one of the rows of the memory 10 has valid address bits, in storage, that are identical to those of the address to be selected, then a grouping of corresponding Exclusive NOR gates (of the 23 to 25 type) makes it possible to assert COMi, the other COM signals being unasserted. The logic circuit 11 then delivers a signal B5 in the state 0 and address bits B1 to B4 corresponding to a replacement address, which select corresponding columns of row 12a.

The change in polarity of the signal B5 selects the row R129 in the memory 1 (by inhibiting the other rows) and replaces the signals A8–A11 by the signals B1–B4 by means of transistors 18–19. This memory 10 is provided, in a known way, with its read circuits 21 and its access decoder 22. The access decoder 22 is used to gain access to a particular row to program it when a new defective address is detected in the memory 1. Likewise, it is also used in the embodiment that sequentially reads through the rows of memory 20.

It will be noted indeed that the transistors 26 to 29 all constitute AND gates, and the logic gates 32 and 34 to 37 are OR gates. Often these are referred to as an "And plane" and as an "Or plane", in the art. Likewise, the PLA structure may utilize so-called "NAND planes" and "Nor planes". Furthermore, as is known, in a PLA type circuit such as this, the array of the AND gates is connected to the array of the OR gates by connections which are themselves programmable. Thus, the gates 38 and 39 may form part of the array of AND gates while the gate 40 may be part of the array of OR gates. In order to place gates 38 and 39 in the "AND plane" and gate 40 in the "Or plane" those skilled in the art will know how to create the logic function which, by factorization, can always take the Boolean form of unions of intersections.

When all the memory cells of the memory 10 are read simultaneously, the redundancy circuit of the invention can be used for parallel-access EEPROM type memories. Indeed, it is observed that the access to the cell or to a replacement word of row R129, is simultaneous with the addressing of the defective cell. By contrast, as regards the serial-access EEPROMs for which the access time is not a constraint, it is possible to cause a successive reading of each of the rows of the memory 10 and to stop the operation as soon as the comparison has revealed the detection of a defective address.

In addition, the exemplary structure of 2048 words and only one redundancy row is for descriptive purposes only. The inventive concept is easily adapted to different size structures and to additional redundancy rows. Those skilled in the art, given the description above, will know how to utilize the invention in embodiments having additional redundancy rows by modifying transistors 14 to decode circuits having the appropriate pass transistors or the like and by modifying the encoding portion of comparison circuit 11 to address more than one row.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. An electrically programmable and erasable non-volatile integrated circuit memory, comprising:
   a plurality of memory words, each word corresponding to an address;
   means for accessing a memory word of the plurality of words in response to the memory receiving an input address;
   a dynamically programmable auxiliary memory for storing addresses of defective memory words;
   a comparison circuit for comparing the input address with an address stored in the dynamically programmable auxiliary memory; and
   a readressing circuit for selecting another memory word from the plurality of memory words in response to the comparison circuit detecting that the input address matches an address stored in the dynamically programmable auxiliary memory;
   wherein the dynamically programmable auxiliary memory includes a valid bit for each stored address to indicate whether the stored address is valid, and wherein the plurality of memory words includes a second plurality of supplementary memory words that are addressable through the readressing circuit only and not through the means for accessing.

2. The memory of claim 1 wherein the comparison circuit is implemented as a programmable logic array.

3. The memory of claim 1 wherein the memory words are arranged according to a row address and a column address and wherein the memory includes a row decoder, receiving a plurality of bits of the input address, and a column decoder, receiving a second plurality of bits of the input address, to address the memory word corresponding to the input address, and wherein the readressing circuit causes the row decoder and the column decoder to address a supplementary memory word of the memory, when the comparison circuit detects that the input address matches a address stored in the dynamically programmable auxiliary memory.

4. The memory of claim 1 wherein the comparison circuit includes means for successively reading through the addresses stored in the dynamically programmable auxiliary memory to compare the addresses stored in the dynamically programmable auxiliary memory with the input address.

5. The memory of claim 1 wherein the comparison circuit has means for simultaneously reading all the addresses stored in the dynamically programmable auxiliary memory and means for simultaneously comparing all the addresses stored in the dynamically programmable auxiliary memory with the input address to detect if the input address matches one of the addresses stored in the dynamically programmable auxiliary memory.

6. The memory of claim 1 wherein the dynamically programmable auxiliary memory includes stored addresses of defective memory words, the stored addresses being stored during operation of the memory.

7. The memory of claim 1 further comprising a verification circuit, coupled to the plurality of memory words and the dynamically programmable auxiliary memory, for determining whether one of the plurality of memory words is defective, the verification circuit providing an address of the defective one of the plurality of memory words to the dynamically programmable auxiliary memory.

8. The memory of claim 7 wherein the verification circuit includes:
   a dynamic memory, coupled to the plurality of memory words and storing a data in response to the data being written to a content of one of the plurality of memory words; and
   a comparison circuit, coupled to the dynamic memory and the plurality of memory words, for comparing the content of the one of the plurality of words with the data stored in the dynamic memory, the comparison circuit determining that the one of the plurality of memory words is defective when the content of the one of the plurality of memory words is not identical to the data stored in the dynamic memory.

9. A memory, comprising:
   a plurality of memory words, each word corresponding to an address;
   means for accessing a memory word of the plurality of words in response to the memory receiving an input address;
   a dynamically programmable auxiliary memory for holding addresses of defective memory words;
   means for comparing the input address with the addresses stored in the dynamically programmable auxiliary memory; and
   means for causing the means for accessing to access a supplemental memory word, rather than a corresponding memory word, if the means for comparing detects that the input address matches an address stored in the dynamically programmable auxiliary memory;
   wherein the dynamically programmable auxiliary memory includes a valid bit for each stored address to indicate whether the stored address is valid and wherein the means for comparing indicates a match only if the valid bit indicates that the stored address is valid.

10. The memory of claim 9 wherein the means for comparing includes means for successively reading through the addresses stored in the dynamically programmable auxiliary memory and for successively comparing the addresses stored in the dynamically programmable auxiliary memory with the input address.

11. The memory of claim 9 wherein the means for comparing includes means for simultaneously reading all of the addresses stored in the dynamically programmable auxiliary memory and for simultaneously comparing all of the addresses stored in the dynamically programmable auxiliary memory with the input address to detect at that the input address matches one of the addresses stored in the dynamically programmable auxiliary memory.

12. The memory of claim 9 wherein the memory words are arranged in an array that is addresses by a row address and a column address, the memory further comprising a row decoder receiving a first plurality of bits of the input address and a column decoder receiving a second plurality of bits of the input address, the row and column decoder addressing the memory array to provide the memory word corresponding to the input address.

13. The memory of claim 12 wherein the means for comparing has means for disabling the row decoder if the input address matches an address stored in the dynamically programmable auxiliary memory and wherein the readressing circuit has means for selecting a supplemental row of the array if the means for comparing detects that the input address matches an address stored in the dynamically programmable auxiliary memory.

14. The memory of claim 9 wherein the dynamically programmable auxiliary memory includes stored addresses of defective memory words, the stored addresses being stored during operation of the memory.

15. The memory of claim 9 further comprising a verification circuit, coupled to the plurality of memory words and the dynamically programmable auxiliary memory, for determining whether one of the plurality of memory words is defective, the verification circuit providing an address of the defective one of the plurality of memory words to the dynamically programmable auxiliary memory.

16. The memory of claim 15 wherein the verification circuit includes:

a dynamic memory, coupled to the plurality of memory words and storing a data in response to the data being written to a content of one of the plurality of memory words; and a comparison circuit, coupled to the dynamic memory and the plurality of memory words, for comparing the content of the one of the plurality of words with the data stored in the dynamic memory, the comparison circuit determining that the one of the plurality of memory words is defective when the content of the one of the plurality of memory words is not identical to the data stored in the dynamic memory.

17. A method of addressing in real time a desired memory word of a memory in response to receiving an input address of the desired word, the method comprising the steps of:

(a) storing a data in a dynamically programmable auxiliary memory in response to the data being written to a content of one memory word of the memory;

(b) comparing the data stored in the dynamically programmable auxiliary memory to the content of the one memory word;

(c) when the data stored in the dynamically programmable auxiliary memory is not identical to the content of the one memory word, storing the address of the one memory word in the dynamically programmable auxiliary memory;

(d) providing the address of the defective memory word to the dynamically programmable auxiliary memory;

(e) the memory comparing the input address with addresses stored in the dynamically programmable auxiliary memory to detect if the input address matches an address of the dynamically programmable auxiliary memory;

(f) if step (e) fails to detect a match between the input address and the stored addresses of the dynamically programmable auxiliary memory, addressing a memory word of a memory array of the memory with the input address; and (g) if step (e) detects a match between an address stored in the dynamically programmable auxiliary memory and the input address, a readressing circuit causing the selection of a supplementary memory word.

18. The method of claim 17 wherein the step (a) of comparing includes comparing the input addresses with addresses that were stored in the dynamically programmable auxiliary memory during operation of the memory.

19. The method of claim 17 wherein the step (a) of comparing includes the steps of:

simultaneously reading all addresses stored in the dynamically programmable auxiliary memory; and simultaneously comparing all of the addresses stored in the dynamically programmable auxiliary memory with the input address.

20. The method of claim 17 wherein the step (a) of comparing includes the steps of:

successively reading through the addresses stored in the dynamically programmable auxiliary memory to compare each of the addresses with the input address.

21. An electrically programmable and erasable non-volatile integrated circuit memory, comprising:

a plurality of memory words, each word corresponding to an address;

means for accessing a memory word of the plurality of words in response to the memory receiving an input address;

an auxiliary memory for storing addresses of defective memory words;

a comparison circuit for simultaneously comparing the input address with the addresses stored in the auxiliary memory; and a readressing circuit for selecting another memory word from the plurality of memory words in response to the comparison circuit detecting that the input address matches an address stored in the auxiliary memory;

wherein the auxiliary memory includes a valid bit for each stored address to indicate whether the stored address is valid, .and wherein the plurality of memory words includes a second plurality of supplementary memory words that are addressable through the readressing circuit only and not through the means for accessing.

22. The memory of claim 21 wherein the memory words are arranged according to a row address and a column address and wherein the memory includes a row decoder, receiving a plurality of bits of the input address, and a column decoder, receiving a second plurality of bits of the input address, to address the memory word corresponding to the input address, and wherein the readressing circuit causes the row decoder and the column decoder to address a supplementary memory word of the memory, when the comparison circuit detects that the input address matches a address stored in the auxiliary memory.

23. A memory, comprising:

a plurality of memory words, each word corresponding to an address;

means for accessing a memory word of the plurality of words in response to the memory receiving an input address;

an auxiliary memory for holding addresses of defective memory words;

means for simultaneously comparing the input address with the addresses stored in the auxiliary memory; and means for causing the means for accessing to access a supplemental memory word, rather than a corresponding memory word, if the means for simultaneously comparing detects that the input address matches an address stored in the auxiliary memory;

wherein the auxiliary memory includes a valid bit for each stored address to indicate whether the stored address is valid and wherein the means for comparing indicates a match only if the valid bit indicates that the stored address is valid.

24. The memory of claim 23 wherein the memory words are arranged in an array that is addresses by a row address and a column address, the memory further comprising a row decoder receiving a first plurality of bits of the input address and a column decoder receiving a second plurality of bits of the input address, the row and column decoder addressing the memory array to provide the memory word corresponding to the input address.

25. A method of addressing in real time a desired memory word of a memory in response to receiving an input address of the desired word, the method comprising the steps of:

(a) the memory simultaneously comparing the input address with addresses stored in an auxiliary memory, such addresses corresponding only to locations within the auxiliary memory that have an active valid bit indicating that such addresses store defective data, to detect if the input address matches an address of the auxiliary memory;

(b) if step (a) fails to detect a match between the input address and the stored addresses of the auxiliary memory, addressing a memory word of a memory array of the memory with the input address; and (c) if step (a) detects a match between an address stored in the auxiliary memory and the input address, a readressing circuit causing the selection of a supplementary memory word.

26. A memory, comprising:

a plurality of memory words, each word corresponding to an address;

means for accessing a memory word of the plurality of words in response to the memory receiving an input address;

a dynamically programmable auxiliary memory for holding addresses of defective memory words;

means for comparing the input address with the addresses stored in the dynamically programmable auxiliary memory;

means for causing the means for accessing to access a supplemental memory word, rather than a corresponding memory word, if the means for comparing detects that the input address matches an address stored in the dynamically programmable auxiliary memory; and a verification circuit, coupled to the plurality of memory words and the dynamically programmable auxiliary memory, for determining whether one of the plurality of memory words is defective, the verification circuit providing an address of the defective one of the plurality of memory words to the dynamically programmable auxiliary memory, the verification circuit including:

a dynamic memory, coupled to the plurality of memory words and storing a data in response to the data being written to a content of one of the plurality of memory words; and a comparison circuit, coupled to the dynamic memory and the plurality of memory words, for comparing the content of the one of the plurality of words with the data stored in the dynamic memory, the comparison circuit determining that the one of the plurality of memory words is defective when the content of the one of the plurality of memory words is not identical to the data stored in the dynamic memory.

27. The memory of claim 26 wherein the means for comparing includes means for successively reading through the addresses stored in the dynamically programmable auxiliary memory and for successively comparing the addresses stored in the dynamically programmable auxiliary memory with the input address.

28. The memory of claim 26 wherein the means for comparing includes means for simultaneously reading all of the addresses stored in the dynamically programmable auxiliary memory and for simultaneously comparing all of the addresses stored in the dynamically programmable auxiliary memory with the input address to detect at that the input address matches one of the addresses stored in the dynamically programmable auxiliary memory.

29. The memory of claim 26 wherein the memory words are arranged in an array that is addresses by a row address and a column address, the memory further comprising a row decoder receiving a first plurality of bits of the input address and a column decoder receiving a second plurality of bits of the input address, the row and column decoder addressing the memory array to provide the memory word corresponding to the input address.

30. The memory of claim 29 wherein the means for comparing has means for disabling the row decoder if the input address matches an address stored in the dynamically programmable auxiliary memory and wherein the readdressing circuit has means for selecting a supplemental row of the array if the means for comparing detects that the input address matches an address stored in the dynamically programmable auxiliary memory.

31. The memory of claim 26 wherein the dynamically programmable auxiliary memory includes stored addresses of defective memory words, the stored addresses being stored during operation of the memory.

32. A memory circuit comprising:

a plurality of memory cells;

an auxiliary memory having a plurality of locations, at least one of the plurality of locations storing an address of a defective memory cell of the plurality of memory cells, the auxiliary memory further storing a valid bit for each of the plurality of locations that is active when an address stored in the respective location represents a defective cell of the plurality of memory cells;

a comparison circuit, coupled to the auxiliary memory, having an input that receives an input address and an output that provides a supplemental address and a defect detection signal that is active when the input address does not match any of the addresses of the defective memory cells having an active valid bit; and an address decoder, having a first input that receives the input address, a second input that receives the supplemental address, and a control input that receives the defect detection signal, the address decoder having an output that provides the input address to the plurality of memory cells when the defect detection signal is not active and that provides the supplemental address to the plurality of memory cells when the defect detection signal is active.

33. The memory circuit of claim 32, wherein:

the plurality of memory cells includes:

a first plurality of memory cells, disposed in a plurality of columns and a plurality of rows, the first plurality of memory cells being addressable by the decoder only when the defect detection signal is not active; and a second plurality of memory cells, disposed in at least one row and a plurality of columns that correspond to the plurality of rows, the second plurality of memory cells being addressable by the decoder only when the defect detection signal is active; and the decoder further includes a row decoder having a first input that receives a portion of the input address, a second input that receives the defect detection signal, a first output that addresses one of the plurality of rows in response to the input address when the defect detection signal is not active, and a second output that addresses the at least one row when the defect detection signal is active.

34. The memory circuit of claim 32, further comprising a programming circuit having an input that receives a write address and data written to the write address in the plurality of memory cells, a second input that receives data stored in the write address in the plurality of memory cells, and an output that provides the write address to the auxiliary memory as a defective address when the data written to the write address does not match the data stored in the write address.

35. The memory circuit of claim 32, wherein the comparison circuit includes:
   a plurality of comparison devices, each of the plurality of comparison devices having a first input that receives the input address, a second input that receives a corresponding one of the addresses of the auxiliary memory, and an output that provides a signal indicative of whether the input address matches the corresponding address; and
   a logic circuit having a plurality of inputs each of which receives the output of a respective one of the plurality of comparison devices, and an output that provides the defect detection signal.

36. A memory circuit comprising:
   a plurality of memory cells;
   an auxiliary memory that stores addresses of defective memory cells of the plurality of memory cells;
   a comparison circuit, coupled to the auxiliary memory, having an input that receives an input address and an output that provides a supplemental address and a defect detection signal that is active when the input address does not match any of the addresses of the defective memory cells;
   an address decoder, having a first input that receives the input address, a second input that receives the supplemental address, and a control input that receives the defect detection signal, the address decoder having an output that provides the input address to the plurality of memory cells when the defect detection signal is not active and that provides the supplemental address to the plurality of memory cells when the defect detection signal is active; and
   a programming circuit having an input that receives a write address and data written to the write address in the plurality of memory cells, a second input that receives data stored in the write address in the plurality of memory cells, and an output that provides the write address to the auxialiary memory as a defective address when the data written to the write address does not match the data stored in the write address.

37. The memory circuit of claim 36, wherein:
   the plurality of memory cells includes:
      a first plurality of memory cells, disposed in a plurality of columns and a plurality of rows, the first plurality of memory cells being addressable by the decoder only when the defect detection signal is not active; and
      a second plurality of memory cells, disposed in at least one row and a plurality of columns that correspond to the plurality of rows, the second plurality of memory cells being addressable by the decoder only when the defect detection signal is active; and
   the decoder further includes a row decoder having a first input that receives a portion of the input address, a second input that receives the defect detection signal, a first output that addresses one of the plurality of rows in response to the input address when the defect detection signal is not active, and a second output that addresses the at least one row when the defect detection signal is active.

38. The memory circuit of claim 36, wherein the comparison circuit includes:
   a plurality of comparison devices, each of the plurality of comparison devices having a first input that receives the input address, a second input that receives a corresponding one of the addresses of the auxiliary memory, and an output that provides a signal indicative of whether the input address matches the corresponding address; and
   a logic circuit having a plurality of inputs each of which receives the output of a respective one of the plurality of comparison devices, and an output that provides the defect detection signal.

39. A memory circuit comprising:
   a plurality of memory cells;
   an auxiliary memory that stores addresses of defective memory cells of the plurality of memory cells;
   a comparison circuit, coupled to the auxiliary memory, having an input that receives an input address and an output that provides a supplemental address and a defect detection signal that is active when the input address does not match any of the addresses of the defective memory cells, the comparison circuit including:
      a plurality of comparison devices, each of the plurality of comparison devices having a first input that receives the input address, a second input that receives a corresponding one of the addresses of the auxiliary memory, and an output that provides a signal indicative of whether the input address matches the corresponding address; and
      a logic circuit having a plurality of inputs each of which receives the output of a respective one of the plurality of comparison devices, and an output that provides the defect detection signal; and
   an address decoder, having a first input that receives the input address, a second input that receives the supplemental address, and a control input that receives the defect detection signal, the address decoder having an output that provides the input address to the plurality of memory cells when the defect detection signal is not active and that provides the supplemental address to the plurality of memory cells when the defect detection signal is active.

40. The memory circuit of claim 39, wherein:
   the plurality of memory cells includes:
      a first plurality of memory cells, disposed in a plurality of columns and a plurality of rows, the first plurality of memory cells being addressable by the decoder only when the defect detection signal is not active; and
      a second plurality of memory cells, disposed in at least one row and a plurality of columns that correspond to the plurality of rows, the second plurality of memory cells being addressable by the decoder only when the defect detection signal is active; and
   the decoder further includes a row decoder having a first input that receives a portion of the input address, a second input that receives the defect detection signal, a first output that addresses one of the plurality of rows in response to the input address when the defect detection signal is not active, and a second output that addresses the at least one row when the defect detection signal is active.

41. A method for providing redundancy for a memory device having a plurality of memory cells, comprising the steps of:

storing data in at least one of a plurality of locations of an auxiliary memory indicative of an address corresponding to a defective cell of the plurality of memory cells;

activating a valid bit in each of the plurality of locations of the auxiliary memory that stores data indicative of a defective cell;

receiving an input address;

comparing the input address to the data stored in each of the plurality of locations of the auxiliary memory having an active valid bit, to determine whether the input address represents a defective cell;

addressing a memory cell corresponding to the input address when the input address does not represent a defective cell; and addressing a supplemental memory cell when the input address represents a defective cell.

42. The method of claim 41, wherein the step of addressing a memory cell includes operating a decoder in a first mode to access the memory cell; and the step of addressing a supplemental memory cell includes operating the decoder in a second mode to access the supplemental memory cell.

43. An apparatus for providing redundancy for a memory device having a plurality of memory cells, the apparatus comprising:

means for storing data in at least one of a plurality of locations of an auxiliary memory indicative of an address corresponding to a defective cell of the plurality of memory cells;

means for activating a valid bit in each of the plurality of locations of the auxiliary memory that stores data indicative of a defective cell;

means for comparing an input address to the data stored in each of the plurality of locations of the auxiliary memory having an active valid bit, to determine whether the input address represents a defective cell;

means for addressing a memory cell corresponding to the input address when the input address does not represent a defective cell; and means for addressing a supplemental memory cell when the input address represents a defective cell.

44. The apparatus of claim 43, further comprising a decoder operable in a first mode and a second mode, and wherein:

the means for addressing a memory cell includes means for operating the decoder in the first mode to access the memory cell; and the means for addressing a supplemental memory cell includes means for operating the decoder in the second mode to access the supplemental memory cell.

\* \* \* \* \*